United States Patent
Ito et al.

(10) Patent No.: US 7,091,114 B2
(45) Date of Patent: Aug. 15, 2006

(54) SEMICONDUCTOR DEVICE AND METHOD OF MANUFACTURING THE SAME

(75) Inventors: Takayuki Ito, Kawasaki (JP); Toshihiko Iinuma, Yokohama (JP); Kyoichi Suguro, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/238,642

(22) Filed: Sep. 11, 2002

(65) Prior Publication Data
US 2003/0193066 A1   Oct. 16, 2003

(30) Foreign Application Priority Data
Apr. 16, 2002   (JP) .............................. 2002-113570

(51) Int. Cl.
*H01L 21/425* (2006.01)
(52) U.S. Cl. ...................... 438/527; 438/519; 438/522; 438/530; 257/E21.335
(58) Field of Classification Search ................ 438/301, 438/303, 305–308, 514, 515, 527–529, 519–522; 257/617, E21.334, E21.335
See application file for complete search history.

(56) References Cited

U.S. PATENT DOCUMENTS

| | | | | |
|---|---|---|---|---|
| 4,151,008 A * | 4/1979 | Kirkpatrick | ................ | 438/799 |
| 5,837,597 A | 11/1998 | Saito | ......................... | 438/528 |
| 6,333,244 B1 * | 12/2001 | Yu | ............................. | 438/528 |
| 2003/0096490 A1 * | 5/2003 | Borland et al. | ............. | 438/513 |

FOREIGN PATENT DOCUMENTS

| | | |
|---|---|---|
| JP | 57-50427 | 3/1982 |
| JP | 63-271916 | 11/1988 |
| JP | 6-29235 | 2/1994 |
| JP | 7-142421 | 6/1995 |
| JP | 8-125182 | 5/1996 |
| JP | 9-17867 | 1/1997 |
| JP | 10-26772 | 1/1998 |
| JP | 2000-138177 | 5/2000 |
| JP | 2000-260710 | 9/2000 |
| JP | 2000-260728 | 9/2000 |
| JP | 2002-329864 | 11/2002 |

OTHER PUBLICATIONS

W. S. Ruska, Microelectronic Processing, 1987, McGraw-Hill Book Co., pp. 317-319.*

Masayuki Tanaka, et al., "Method of Manufacturing Semiconductor Device and the Semiconductor Device", U.S. Appl. No. 09/973,744, filed on Oct. 11, 2001.

T. Ito, et al., "Flash Lamp Anneal Technology for Effectively Activating Ion Implanted Si," Extended Abstracts of the 2001 International Conference on Solid State Devices and Materials, Tokyo, 2001, pp. 182-183.

(Continued)

*Primary Examiner*—Allan R. Wilson
(74) *Attorney, Agent, or Firm*—Finnegan, Henderson, Farabow, Garrett & Dunner, L.L.P.

(57) ABSTRACT

Disclosed is a method for manufacturing a semiconductor device comprising implanting ions of an impurity element into a semiconductor region, implanting, into the semiconductor region, ions of a predetermined element which is a group IV element or an element having the same conductivity type as the impurity element and larger in mass number than the impurity element, and irradiating a region into which the impurity element and the predetermined element are implanted with light to anneal the region, the light having an emission intensity distribution, a maximum point of the distribution existing in a wavelength region of not more than 600 nm.

19 Claims, 13 Drawing Sheets

OTHER PUBLICATIONS

Final Notice of Rejection issued by Japanese Patent Office mailed Nov. 24, 2004 in Japanese application No. 2002-113570, and English translation of Notice.

T. Watabiki "Decision of Dismissal of Amendment," mailed by the Japanese Patent Office on Jun. 7, 2005 in counterpart Japanese Application No. 2001-113570.

* cited by examiner

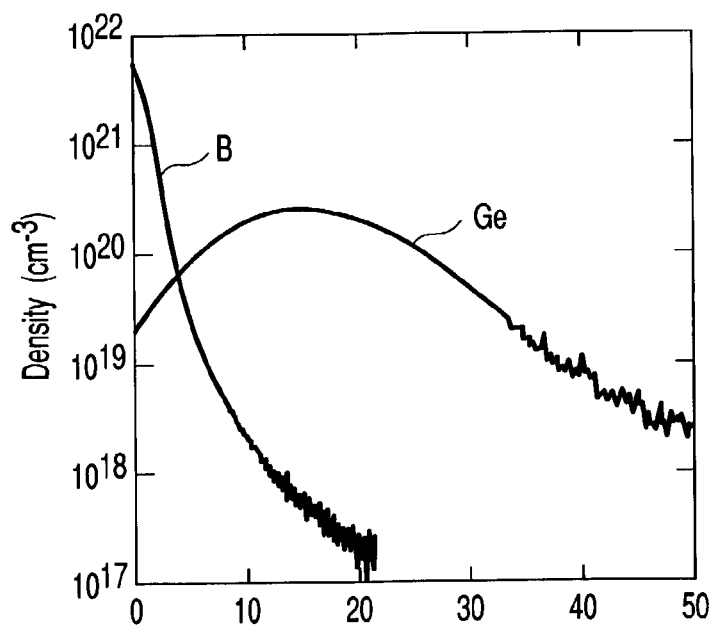
F I G. 3
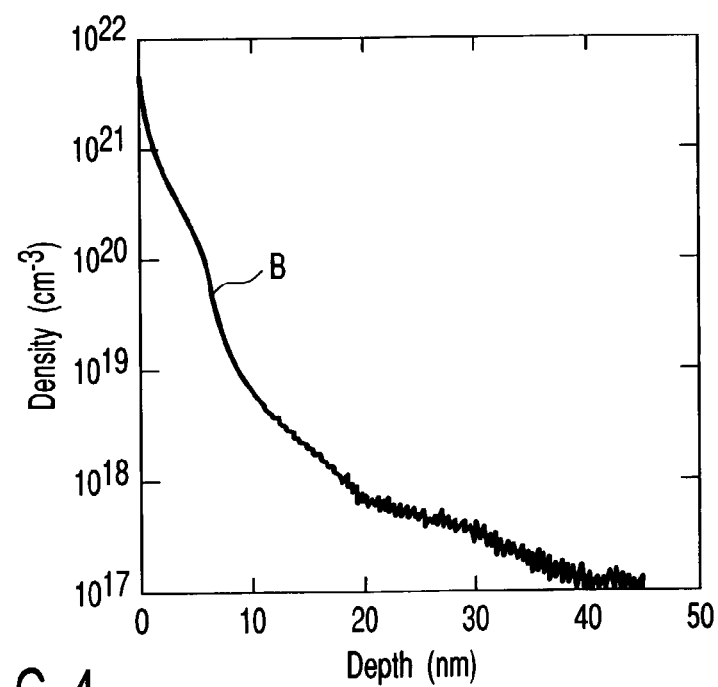
F I G. 4

SEMICONDUCTOR DEVICE AND METHOD OF MANUFACTURING THE SAME

CROSS-REFERENCE TO RELATED APPLICATIONS

This application is based upon and claims the benefit of priority from the prior Japanese Patent Application No. 2002-113570, filed Apr. 16, 2002, the entire contents of which are incorporated herein by reference.

BACKGROUND OF THE INVENTION

1. Field of the Invention

The present invention relates to a semiconductor device and a semiconductor device manufacturing method and, more particularly, to a thermal annealing technology.

2. Description of the Related Art

High integration of LSIs has been achieved by reducing sizes of elements constructing LSIs. With decreasing dimensions of elements, the formation of a shallow p-n junction, i.e., the formation of a shallow impurity diffusion region is becoming important.

To form this shallow impurity diffusion region, ion implantation at low acceleration energy and optimization of subsequent annealing are important. Boron (B) is used as a p-type impurity, and phosphorus (P) and arsenic (As) is used as an n-type impurity. However, these impurities have larger diffusion coefficients in silicon (Si). Therefore, these impurities diffuse inward and outward when RTA (Rapid Thermal Anneal) using a halogen lamp is performed. This gradually makes it difficult to obtain a shallow impurity diffusion layer. If the annealing temperature is lowered to suppress impurity diffusion, the activation ratio of the impurity largely decreases. By RTA using a halogen lamp, therefore, it is difficult to form an impurity diffusion layer having a shallow (about 20 nm or less) junction and low resistance.

To solve the above problem, a flash lamp annealing method using a xenon (Xe) flash lamp is being studied as a method of momentarily supplying energy required for activation. A Xe flash lamp is obtained by sealing Xe gas in a tube such as a quartz tube. This Xe flash lamp can emit white light within the range of, e.g., a few 100 μsec to a few msec by discharging electric charge stored in a capacitor within a short time period. Accordingly, an impurity can be activated without changing the distribution of impurity ions implanted into a semiconductor layer.

Unfortunately, the light of the flash lamp is reflected by the surface of a semiconductor substrate to worsen the heating efficiency. This makes sufficient impurity activation difficult. If the irradiation energy of the flash lamp is increased to raise the activation ratio, the thermal stress increases, and this destroys the semiconductor substrate. That is, the conventional flash lamp annealing method can form an impurity diffusion region having a shallow junction but cannot unlimitedly lower the resistance of the diffusion layer.

Another conventional technique known to those skilled in the art is to form a light-absorbing film to efficiently absorb lamp light during annealing. Jpn. Pat. Appln. KOKAI Publication No. 10-26772 discloses a technique which forms a light-absorbing film on the surface of a gate insulating film in the fabrication of a TFT (Thin Film Transistor). Since, however, the light-absorbing film formed on the surface of a gate insulating film is used, efficient heating is difficult to perform. Jpn. Pat. Appln. KOKAI Publication No. 2000-138177 discloses a technique which forms a light-absorbing film on the surface of an interlayer insulating film in the fabrication of a semiconductor device. However, the use of the light-absorbing film formed on the surface of an interlayer insulating film also makes efficient heating difficult.

As described above, as the integration degree of LSIs increases, it is becoming important to control the impurity profile with high accuracy, e.g., to form a shallow, low-resistance impurity diffusion layer. However, accurately controlling the impurity profile is conventionally difficult.

BRIEF SUMMARY OF THE INVENTION

A first aspect of the present invention is a method for manufacturing a semiconductor device comprising: implanting ions of an impurity element into a semiconductor region; implanting, into the semiconductor region, ions of a predetermined element which is a group IV element or an element having the same conductivity type as the impurity element and larger in mass number than the impurity element; and irradiating a region into which the impurity element and the predetermined element are implanted with light to anneal the region, the light having an emission intensity distribution, a maximum point of the distribution existing in a wavelength region of not more than 600 nm.

A second aspect of the present invention is a method for manufacturing a semiconductor device comprising: forming a gate insulating film on a semiconductor substrate; forming a gate electrode on the gate insulating film; implanting ions of an impurity element into the semiconductor substrate by using at least the gate electrode as a mask; implanting, into the semiconductor substrate, ions of a predetermined element which is a group IV element or an element having the same conductivity type as the impurity element and larger in mass number than the impurity element, by using at least the gate electrode as a mask; and irradiating a region into which the impurity element and the predetermined element are implanted with light to anneal the region, the light having an emission intensity distribution, a maximum point of the distribution existing in a wavelength region of not more than 600 nm.

A third aspect of the present invention is a semiconductor device comprising: a first semiconductor region of a first conductivity type; and a second semiconductor region of a second conductivity type formed on the first semiconductor region and containing an impurity element of the second conductivity type, wherein the second semiconductor region includes at least a portion of a region containing a predetermined element which is a group IV element or an element of the second conductivity type larger in mass number than the impurity element; and the predetermined element has a density distribution in a depth direction, and a value of depth of a maximum point of the density distribution from a surface of the second semiconductor region is smaller than a value of depth of a boundary between the first and second semiconductor regions from the surface of the second semiconductor region.

BRIEF DESCRIPTION OF THE SEVERAL VIEWS OF THE DRAWING

FIG. 3 is a graph showing the density distributions of Ge and B in a semiconductor device obtained by the steps shown in FIGS. 1A to 1C;

FIG. 4 is a graph sowing the density distribution of B in a semiconductor device obtained by the steps shown in FIGS. 2A and 2B;

DETAILED DESCRIPTION OF THE INVENTION

Embodiments of the present invention will be described with reference to the accompanying drawing.

FIRST EMBODIMENT

Figure 1A:
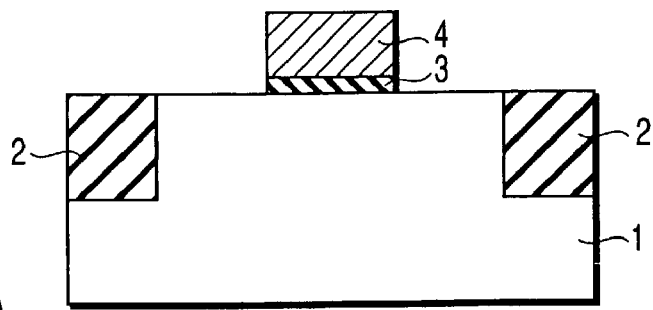
FIGS. 1A to 1C are sectional views showing a semiconductor device fabrication method according to the first embodiment of the present invention.
Figure 1B:
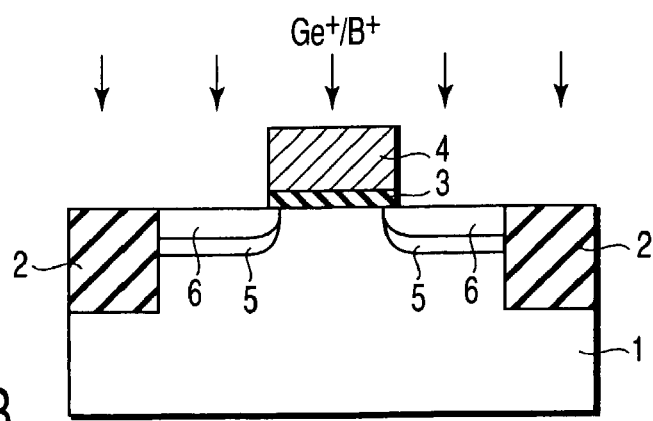
Figure 1C:
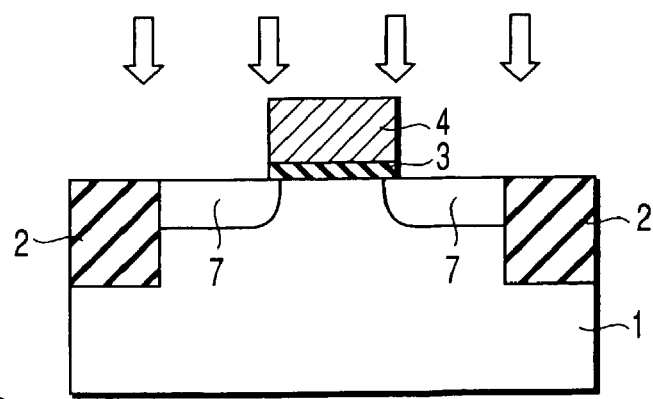

FIGS. 1A to 1C are sectional views showing a semiconductor device fabrication method according to the first embodiment of the present invention. This method will be explained by taking the fabrication steps of a p-type MOS transistor as an example.

First, as shown in FIG. 1A, in accordance with the conventional p-type MOS transistor fabrication method, isolation regions 2 are formed in an n-type silicon (Si) substrate 1. After that, a gate insulating film (silicon oxide film) 3 is formed, and a gate electrode 4 is formed on this gate insulating film 3.

Next, as shown in FIG. 1B, the gate electrode 4 is used as a mask to implant germanium (Ge) ions into the surface region of the n-type silicon substrate 1. The conditions of this ion implantation are an acceleration energy of 15 keV and a dose of $5 \times 10^{14}$ cm$^{-2}$. By this ion implantation, crystal defect regions 5 are formed in the surface of the silicon substrate 1. For example, amorphous crystal defect regions 5 are formed. The depth of an end portion of this crystal defect region 5 is about 20 nm from the surface of the silicon substrate 1.

By using the gate electrode 4 as a mask, boron (B) ions are implanted into the surface region of the silicon substrate 1. The ion implantation conditions are an acceleration energy of 0.2 keV and a dose of $1 \times 10^{15}$ cm$^{-2}$. By this ion implantation, impurity regions 6 are formed at the upper portions of the crystal defect regions 5 so as to overlap these crystal defect regions 5.

Subsequently, as shown in FIG. 1C, a xenon (Xe) flash lamp is used to irradiate the entire substrate surface with light. The irradiation time is 10 ms or less, and the irradiation energy density is 35 J/cm$^2$. This light irradiation (flash lamp anneal) activates the impurity elements and recovers defects in the crystal defect regions 5 and the impurity regions 6. Consequently, p-type source·drain diffusion layers 7 are obtained. Note that before this light irradiation, the substrate is desirably heated to a temperature of about 400° C.

Although the subsequent steps are not shown, a silicon oxide film is formed as an interlayer insulating film on the entire surface at a film formation temperature of 400° C. by, e.g., atmospheric CVD. After that, contact holes are formed in the interlayer insulating film, and source·drain electrodes, a gate electrode, interconnections and the like are formed.

Figure 2A:
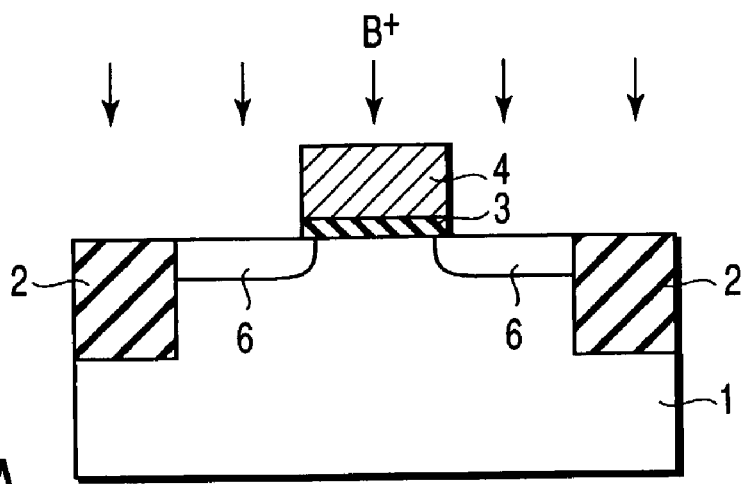
FIGS. 2A and 2B are sectional views showing a fabrication method of a comparative example of the first embodiment.
Figure 2B:
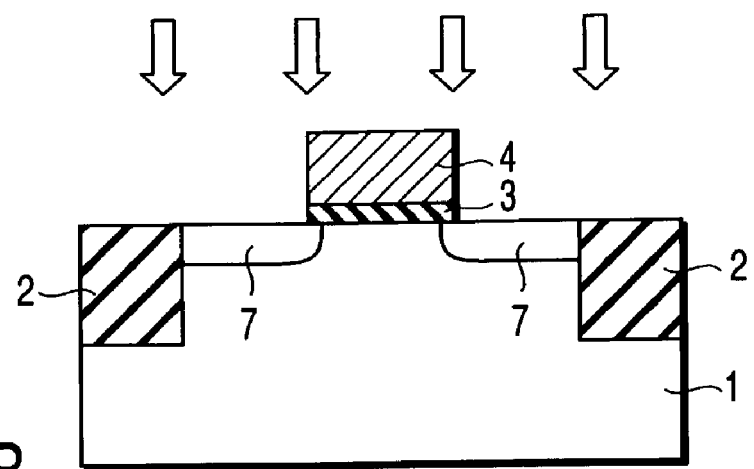

FIGS. 2A and 2B are sectional views showing a fabrication method of a comparative example of the first embodiment. In this comparative example, no Ge ions are implanted into a silicon substrate 1, and B ions are implanted under the same conditions as in the above embodiment. After that, xenon flash lamp light is emitted under the same conditions as in the above embodiment.

FIG. 3 shows the density distributions of Ge and B obtained by the steps shown in FIGS. 1A to 1C. FIG. 4 shows the density distribution of B obtained by the steps shown in FIGS. 2A and 2B.

In this embodiment, a depth at which the Ge density is $10^{18}$ cm$^{-3}$ is about 55 nm, and a depth at which the B density is $10^{18}$ cm$^{-3}$ is about 12 nm. In contrast, in the comparative example a depth at which the B density is $10^{18}$ cm$^{-3}$ is about 18 nm. That is, the region in which B is distributed in this embodiment is shallower than in the comparative example. This is so because when ion implantation of Ge larger in mass (mass number) than B is performed, a large amount of crystal defects are generated in the substrate surface to result in an amorphous state, and this suppresses the channeling phenomenon of B.

The sheet resistance of the diffusion layer was measured and found to be 7 kΩ/□ in the sample of the comparative example in which no Ge ions were implanted, and 510 Ω/□ in the sample of this embodiment in which Ge ions were implanted. This indicates that the resistance of the diffusion layer significantly lowered. In addition, resistance variations on the substrate surface were measured. As a consequence, σ=10% in the sample of the comparative example and σ<1.5% in the sample of this embodiment, indicating improvement of the uniformity.

As described above, the impurity profile can be accurately controlled by combining Ge ion implantation and flash lamp anneal. This makes it possible to form a low-resistance p-type source·drain diffusion layer having a shallow junction with a depth of 20 nm or less.

Figure 5A:
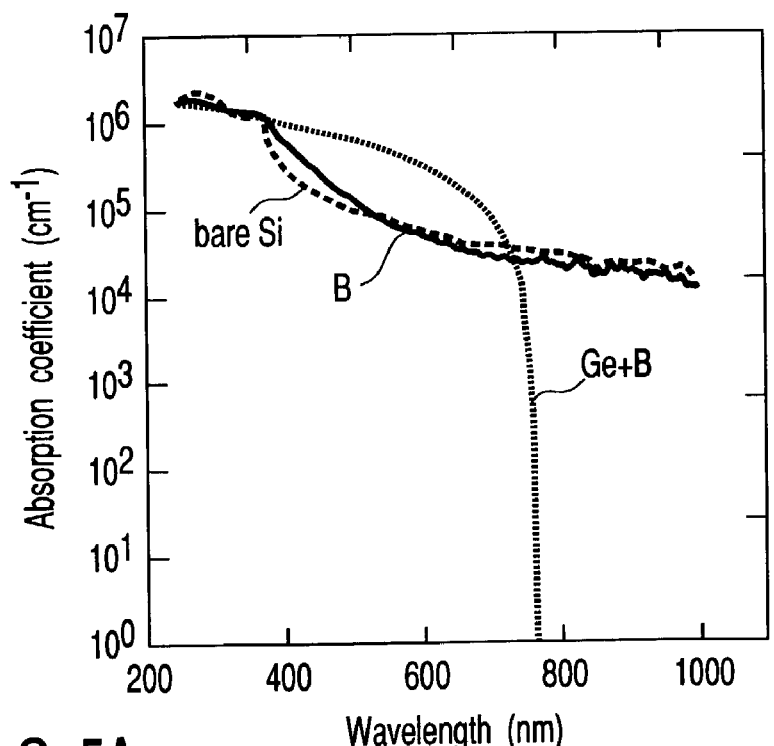
FIGS. 5A and 5B are graphs showing absorption spectra and reflection spectra of the silicon substrate surface.
Figure 5B:
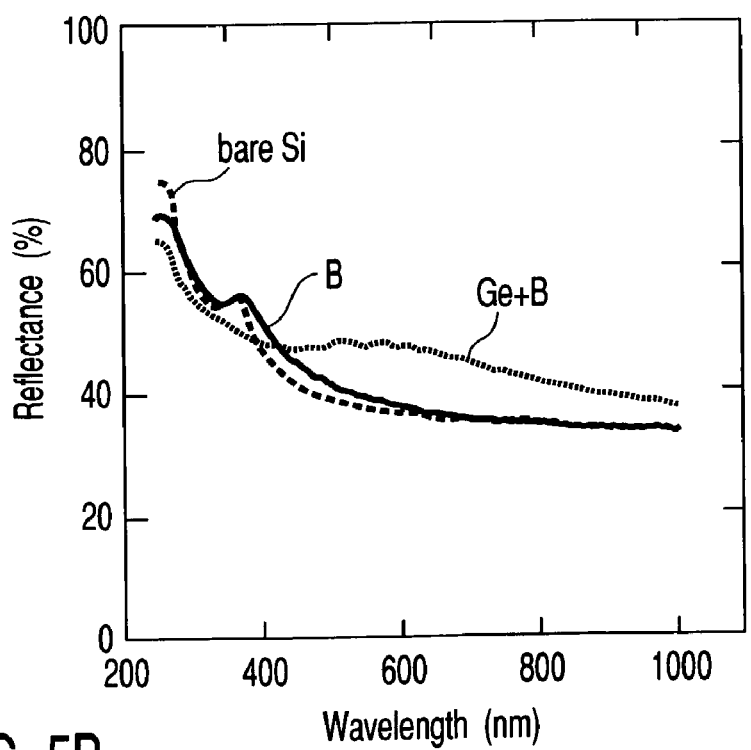

To examine the reasons for the reduction in the resistance of the diffusion layer and for the improvement of the uniformity of the diffusion layer resistance, the optical characteristics of the silicon substrate surface was measured. FIG. 5A is a graph showing absorption spectra of the silicon substrate surface. FIG. 5B is a graph showing reflection spectra of the silicon substrate surface.

Differences in absorption spectra and reflection spectra are small between a Si substrate (bare Si) into which no ions are implanted and a substrate into which low acceleration B ions are implanted. However, by ion implantation of Ge, the absorption coefficient increases by about ten times at a wavelength region of 400 nm to 700 nm. In the Si substrate (bare Si) into which no ions are implanted, peaks are observed near 360 and 260 nm. These peaks are related to critical points $E_1$ ($L_3 \rightarrow L_1$) and $E_2$ ($X_4 \rightarrow X_1$) of a band structure. When Ge is ion-implanted, these two peaks disappear. This indicates that a large amount of crystal defects are generated in the substrate surface to break the periodicity of the crystal. On the other hand, the Ge ion implantation decreases the absorption coefficient at a wavelength of 750 nm or more. This is observed as an increase of the reflectance of FIG. 5B. It is considered that these results are caused by the light interference effect at the interface between the crystal defect layer (amorphous layer) formed by the Ge ion implantation and the single crystal layer (crystal defect-less layer).

Figure 6:
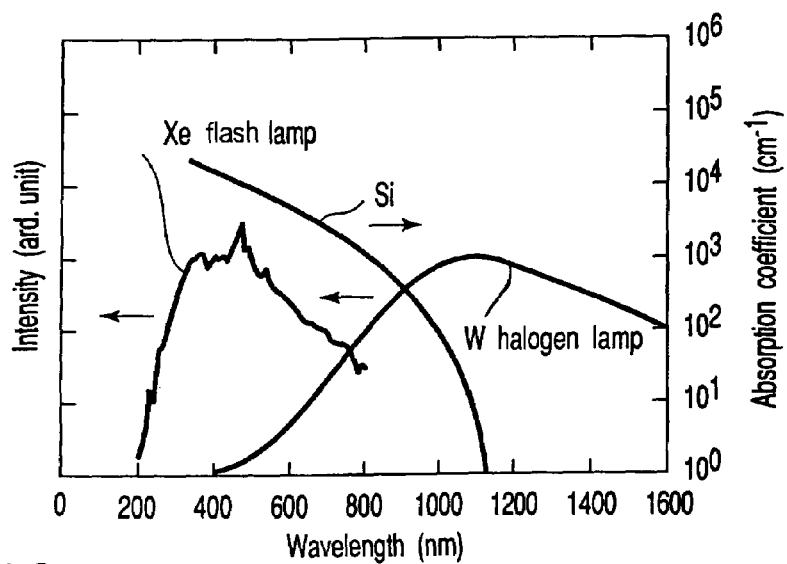
FIG. 6 is a graph showing the emission spectra of a Xe flash lamp and W halogen lamp and an Si absorption characteristic.

FIG. 6 shows the emission spectra (emission intensity distributions) of a Xe flash lamp and W halogen lamp, and the absorption characteristic of Si. While the emission intensity of the halogen lamp is high at longer wavelengths, the emission intensity of the flash lamp is high in the visible light region, particularly, in a region of about 250 to 500 nm. Additionally, the light absorptivity of Si is high in the visible light region.

From the foregoing, the emission energy is absorbed by silicon more efficiently when the flash lamp is used than when the halogen lamp is used. In addition, by generating a large amount of crystal defects in the surface region of a silicon substrate by ion implantation of Ge, the absorptivity of the silicon substrate surface can be raised in a wavelength region in which the emission intensity of the flash lamp is high. Accordingly, the heating efficiency can be raised by combining Ge ion implantation and flash lamp anneal. This makes it possible to efficiently activate an impurity such as B without breaking its profile.

Figure 7:
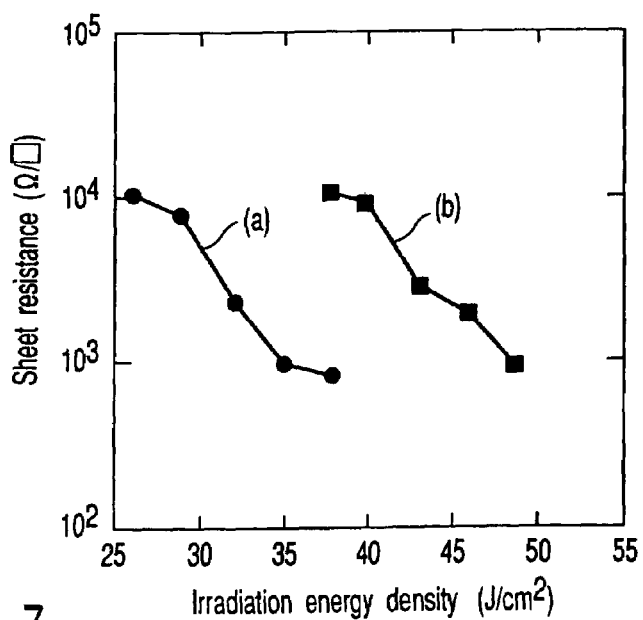
FIG. 7 is a graph showing the relationship between the irradiation energy density and the sheet resistance.

FIG. 7 shows the results of examination of the relationship between the irradiation energy density and the sheet resistance after the step shown in FIG. 1C of this embodiment. A curve (a) indicates the result when a flash lamp from which no ultraviolet light is cut is used; a curve (b) indicates the result when a flash lamp from which ultraviolet light of 400 nm or less is cut. A change in the sheet resistance of the impurity diffusion layer shows that when the ultraviolet light is cut, there is a power loss of about 30%. That is, in common flash lamp irradiation, ultraviolet light effectively heats an Si substrate.

An Si substrate into which B was implanted at 10 keV and $5 \times 10^{15}$ cm$^{-2}$ and an Si substrate into which B was implanted under the same conditions as the first substrate and then Ge was implanted at 1 keV and $5 \times 10^{14}$ cm$^{-2}$ were prepared. Flash lamp anneal was performed for these substrates at a substrate temperature of 400° C. and an irradiation energy density of 35 J/cm$^2$. Consequently, the sheet resistance of the sample into which only B was ion-implanted was 320 Ω/□, whereas the sheet resistance of the sample into which both Ge and B were ion-implanted was 100 Ω/□. A depth at which the B density was $1 \times 10^{18}$ cm$^{-3}$ was about 150 nm, and depth at which the Ge density was $1 \times 10^{18}$ cm$^{-3}$ was about 10 nm. That is, Ge was not contained in the whole region containing B. This means that the above result is different from the effect of the conventional pre-amorphous formation process or the effect of increasing the activation ratio of B by the existence of Ge at high density.

Furthermore, to prove the difference from the effect of the existence of Ge at high density, Ge was ion-implanted, annealing was subsequently performed at 550° C. for 1 hr to recover the crystal state, B was subsequently ion-implanted, and then flash lamp anneal was performed. The sheet resistance of the diffusion layer of this sample was found to be 7 kΩ/□, i.e., the sheet resistance could not be lowered.

From the foregoing, the sheet resistance of the impurity diffusion layer was lowered and the uniformity of the sheet resistance was improved by Ge ion implantation presumably because Ge made the surface region of the Si substrate amorphous and this improved the recovery of the crystallinity, and because the heating efficiency by flash lamp irradiation was raised due to an increase of the absorption coefficient in the visible light region and an increase of the light reflectance in the near infrared region by the light interference effect at the interface between the amorphous layer and the crystal layer.

In this embodiment as described above, the profile of an impurity can be accurately controlled by combining ion implantation of Ge and irradiation of light for a short time by a flash lamp. Accordingly, a shallow, high-density, low-resistance diffusion layer can be formed.

SECOND EMBODIMENT

Figure 10A:
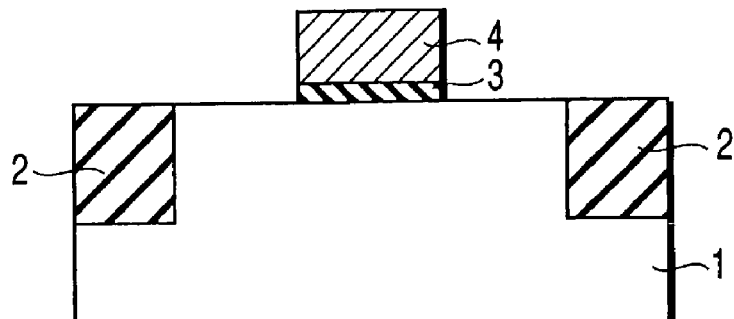
FIGS. 10A to 10C are sectional views showing a semiconductor device fabrication method according to the second embodiment of the present invention.
Figure 10B:
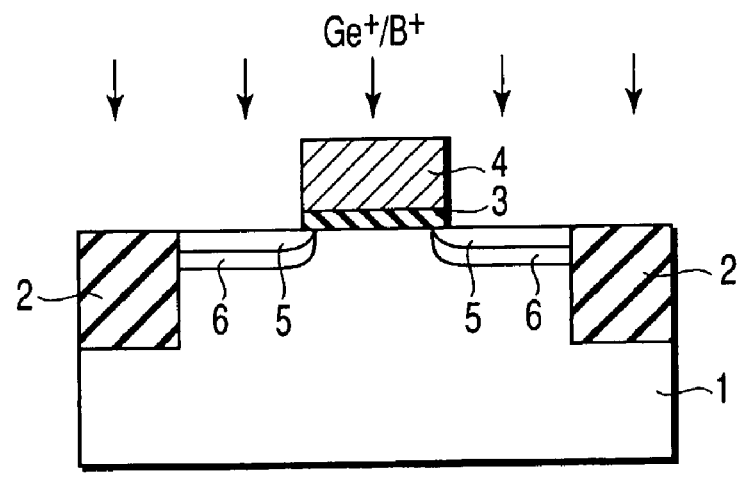
Figure 10C:
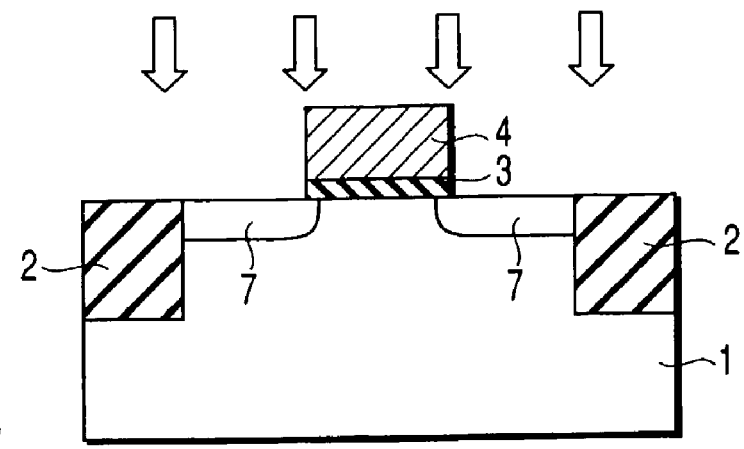

FIGS. 10A to 10C are sectional views showing a semiconductor device fabrication method according to the second embodiment of the present invention. This method will be explained by taking the fabrication steps of a p-type MOS transistor as an example.

In this embodiment, an ion implantation region (Ge diffusion layer) of Ge (predetermined element) is shallower than an ion implantation region (B diffusion layer) of B (impurity element). More specifically, the density of Ge is made lower than that of B at the boundary (p-n junction boundary) between an n-type semiconductor substrate and a p-type B diffusion layer. From another viewpoint, a position at which the Ge density is equal to the B density at the p-n junction boundary is present between the surface of a semiconductor substrate and the p-n junction boundary. For example, the B density at the p-n junction boundary is about $1 \times 10^{18}$/cm$^3$. From still another viewpoint, a position at which the density distribution of Ge is a maximum is shallower than a position at which the B density is $1 \times 10^{18}$/cm$^3$.

First, as shown in FIG. 10A, in accordance with the conventional p-type MOS transistor fabrication method, isolation regions 2 are formed in an n-type silicon (Si) substrate 1. After that, a gate insulating film (silicon oxide film) 3 is formed, and a gate electrode 4 is formed on this gate insulating film 3.

Next, as shown in FIG. 10B, the gate electrode 4 is used as a mask to ion-implant Ge into the surface region of the n-type silicon substrate 1. The conditions of this ion implantation are an acceleration energy of 1 keV and a dose of $5 \times 10^{14}$ cm$^{-2}$. By this ion implantation, crystal defect regions 5 are formed in the surface of the silicon substrate 1. The gate electrode 4 is again used as a mask to ion-implant B into the surface region of the silicon substrate 1. The ion implantation conditions are an acceleration energy of 0.2 keV and a dose of $1 \times 10^{15}$ cm$^{-2}$. By this ion implantation, impurity regions 6 are formed below the crystal defect regions 5 so as to overlap these crystal defect regions 5.

Subsequently, as shown in FIG. 10C, a xenon (Xe) flash lamp is used to irradiate the entire substrate surface with light. The irradiation time is 10 ms or less, and the irradiation energy density is 35 J/cm$^2$. This light irradiation (flash lamp anneal) activates the impurity elements and recovers defects in the crystal defect regions 5 and the impurity regions 6. Consequently, p-type source·drain diffusion layers 7 are obtained. Note that before this light irradiation, the substrate is desirably heated to a temperature of about 400° C.

Although the subsequent steps are not shown, a silicon oxide film is formed as an interlayer insulating film on the entire surface at a film formation temperature of 400° C. by, e.g., atmospheric CVD. After that, contact holes are formed in the interlayer insulating film, and source·drain electrodes, a gate electrode, interconnections and the like are formed.

Figure 11:
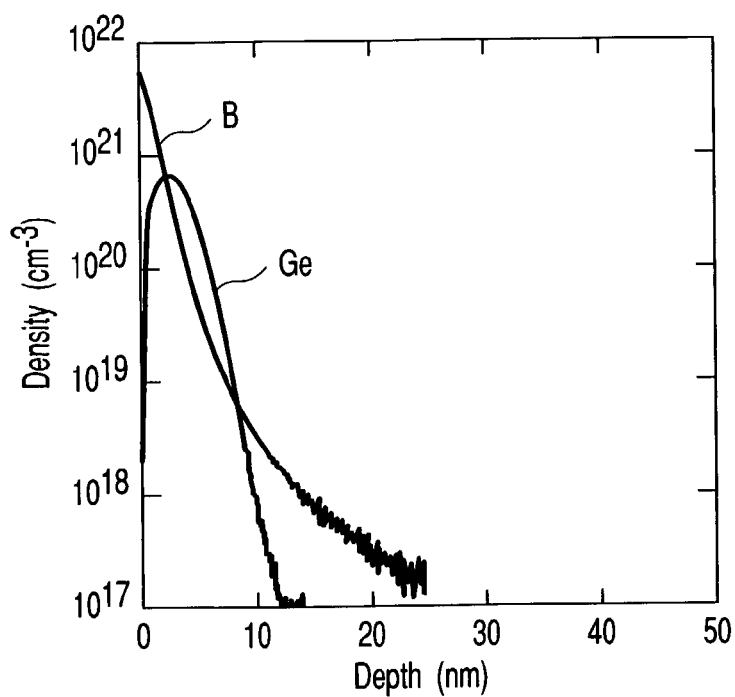
FIG. 11 is a graph showing the density distributions of Ge and B in a semiconductor device obtained by the steps shown in FIGS. 10A to 10C.

FIG. 11 shows the density distributions of Ge and B obtained by the steps shown in FIGS. 10A to 10C. In this embodiment, a depth at which the Ge density is $10^{18}$ cm$^{-3}$ is about 10 nm, and a depth at which the B density is $10^{18}$ cm$^{-3}$ is about 14 nm. That is, Ge is not distributed in the whole impurity region into which B is implanted; the Ge diffusion layer is formed to be shallower than the B diffusion layer.

The sheet resistance of the diffusion layer was measured and found to be 960 Ω/□, much lower than when no Ge was implanted. This means that this result is different from the effect of the conventional pre-amorphous formation process or the effect of increasing the activation ratio of B by the existence of Ge at high density.

The junction leakage current was also measured. Consequently, while the junction leakage current was $2\times10^{-12}$ A/μm$^2$ in the first embodiment, the junction leakage current was $6\times10^{-17}$ A/μm$^2$ in this embodiment, indicating that the p-n junction characteristics greatly improved. This is probably because the Ge diffusion layer was formed in a region shallower than the B diffusion layer, so no crystal defects caused by Ge were present in a depletion layer. Also, if crystal defects are formed in a region deeper than the B diffusion layer, diffusion of B may be induced in the annealing step performed later, and this may deteriorate the transistor characteristics. In this embodiment, however, diffusion of B like this can be suppressed.

In this embodiment as described above, the same effects as in the first embodiment can be obtained. In addition, since the Ge diffusion layer is made shallower than the B diffusion layer, it is possible to reduce the leakage current and suppress B diffusion. Accordingly, fine transistors superior in characteristics and reliability can be obtained.

Figure 8:
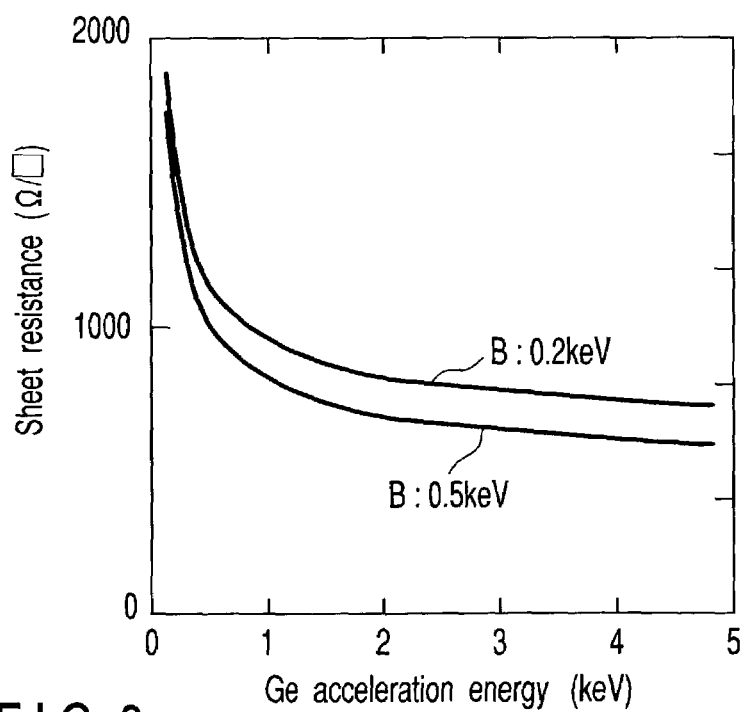
FIG. 8 is a graph showing the relationship between the Ge acceleration energy and the sheet resistance.
Figure 9:
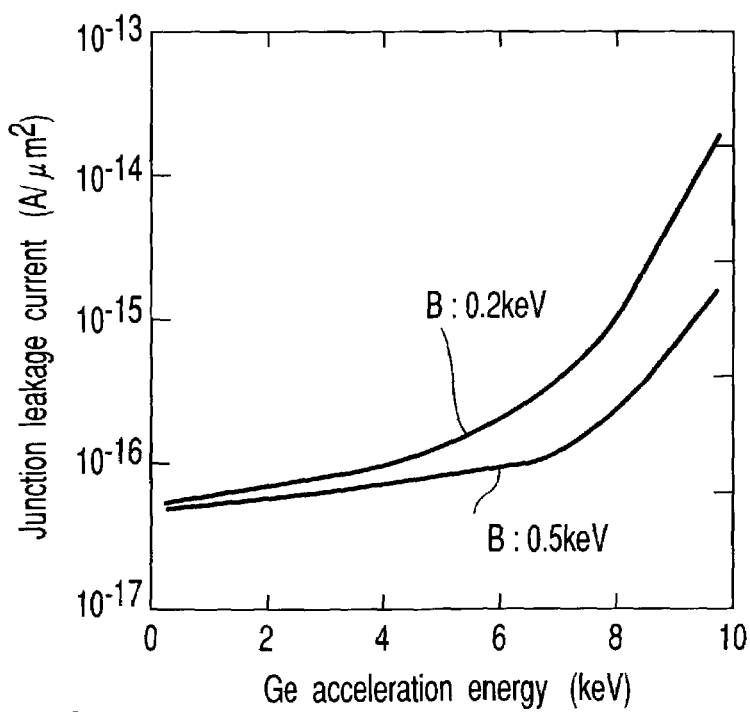
FIG. 9 is a graph showing the relationship between the Ge acceleration energy and the junction leakage current.

FIGS. 8 and 9 show the relationship between the Ge ion implantation acceleration condition (the dose is $5\times10^{14}$ cm$^{-2}$) and the sheet resistance and the relationship between the Ge ion implantation acceleration energy and the p-n junction leakage current, respectively, when an Si substrate into which B is implanted at an acceleration energy of 0.2 to 0.5 keV and a dose of $1\times10^{15}$ cm$^{-2}$ is subjected to flash lamp anneal at a substrate temperature of 400° C. and an irradiation energy density of 35 J/cm$^2$.

As shown in FIG. 8, the sheet resistance lowers as the Ge acceleration energy increases. For example, when the B acceleration energy is 0.2 keV, a sheet resistance of 1,000 Ω/□ can be obtained if Ge is implanted at an acceleration energy of 0.8 keV or more; when the B acceleration energy is 0.5 keV, a sheet resistance of 1,000 Ω/□ can be obtained if Ge is implanted at an acceleration energy of 0.5 keV or more.

On the other hand, as shown in FIG. 9, the p-n junction leakage current increases as the Ge acceleration energy increases. For example, when the B acceleration energy is 0.2 keV, the junction leakage current is $10^{-16}$ A/μm$^2$ or more if the Ge acceleration energy exceeds 4 keV; when the B acceleration energy is 0.5 keV, the junction leakage current is $10^{-16}$ A/μm$^2$ or more if the Ge acceleration energy exceeds 6 keV.

Accordingly, when the B acceleration energy is 0.2 keV, the Ge acceleration energy is preferably 0.8 keV or more and 4 keV or less; when the B acceleration energy is 0.5 keV, the Ge acceleration energy is preferably 0.5 keV or more and 6 keV or less.

For example, under conditions as described above a position (p-n junction boundary) at which the B density is $10^{18}$ cm$^{-3}$ can be set in the range of a depth of 20 nm or less. In addition, under the above conditions the projected range of Ge ion implantation (a maximum point of the Ge density distribution) can be made shallower than the p-n junction boundary. Also, a value (depth) obtained by adding a standard deviation of the density distribution to the projected range can be made shallower than the p-n junction boundary.

In the first and second embodiments described above, after Ge is ion-implanted as a group IV element into a silicon substrate (group IV semiconductor substrate), B is ion-implanted as an impurity element. However, a group IV element can be ion-implanted after an impurity element is ion-implanted. Also, as a group IV element, Si, Sn, or Pb can be used instead of Ge. Furthermore, the dose of a group IV element need only fall within the range in which a certain amount of crystal defects or more are produced in the surface region of an Si substrate (preferably, within the range in which the surface region of an Si substrate is made amorphous). More specifically, the dose of a group IV element is desirably $1\times10^{14}$ cm$^{-2}$ or more and $1\times10^{16}$ cm$^{-2}$ or less.

In each of the above first and second embodiments, a p-channel MOS (MIS) FET is explained. However, a similar method can also be applied to an n-channel MOS (MIS) FET. In this case, phosphorus (P) or arsenic (As) is used as an n-type impurity to be implanted into a p-type silicon substrate. When RTA (Rapid Thermal Anneal) using a halogen lamp as a heating source is performed for an n-type impurity, as the Ge addition amount increases the carrier density decreases and the resistance of the diffusion layer increases. Since the heating efficiency can be increased by the use of flash lamp anneal, the resistance of the diffusion layer can be effectively lowered.

THIRD EMBODIMENT

Figure 12A:
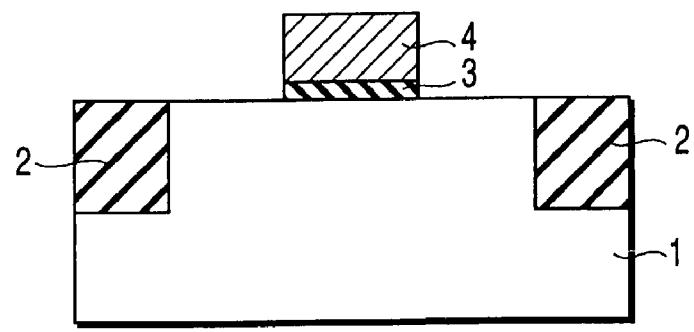
FIGS. 12A to 12C are sectional views showing a semiconductor device fabrication method according to the third embodiment of the present invention.
Figure 12B:
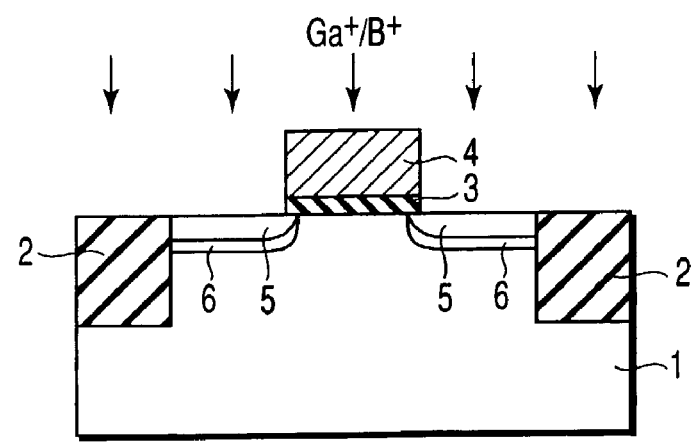
Figure 12C:
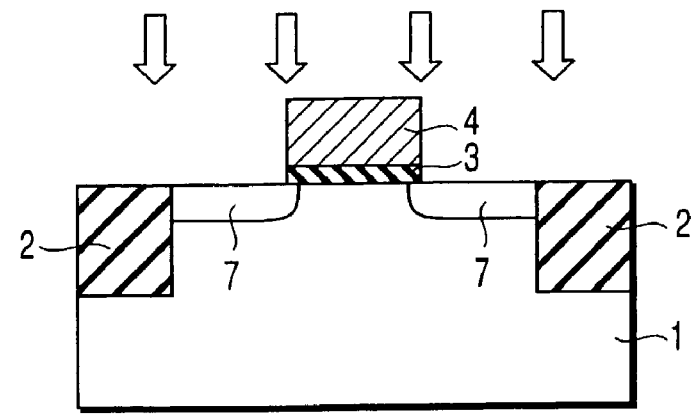

FIGS. 12A to 12C are sectional views showing a semiconductor device fabrication method according to the third embodiment of the present invention. This method will be explained by taking the fabrication steps of a p-type MOS transistor as an example.

In this embodiment, Ga is used instead of Ge as an element for forming crystal defect regions 5. Additionally, an ion implantation region (Ga diffusion layer) of Ga (predetermined element) is shallower than an ion implantation region (B diffusion layer) of B (impurity element).

First, as shown in FIG. 12A, in accordance with the conventional p-type MOS transistor fabrication method, isolation regions 2 are formed in an n-type silicon (Si)

substrate 1. After that, a gate insulating film (silicon oxide film) 3 is formed, and a gate electrode 4 is formed on this gate insulating film 3.

Next, as shown in FIG. 12B, the gate electrode 4 is used as a mask to ion-implant Ga into the surface region of the n-type silicon substrate 1. The conditions of this ion implantation are an acceleration energy of 1 keV and a dose of $5\times10^{14}$ cm$^{-2}$. By this ion implantation, crystal defect regions 5, e.g., amorphous regions, are formed in the surface of the silicon substrate 1. The gate electrode 4 is again used as a mask to ion-implant B into the surface region of the silicon substrate 1. The ion implantation conditions are an acceleration energy of 0.2 keV and a dose of $1\times10^{15}$ cm$^{-2}$. By this ion implantation, impurity regions 6 are formed below the crystal defect regions 5 so as to overlap these crystal defect regions 5.

Subsequently, as shown in FIG. 12C, a xenon (Xe) flash lamp is used to irradiate the entire substrate surface with light. The irradiation time is 10 ms or less, and the irradiation energy density is 35 J/cm$^2$. This light irradiation (flash lamp anneal) activates the impurity elements and recovers defects in the crystal defect regions 5 and the impurity regions 6. Consequently, p-type source·drain diffusion layers 7 are obtained. Note that before this light irradiation, the substrate is desirably heated to a temperature of about 400° C.

Although the subsequent steps are not shown, a silicon oxide film is formed as an interlayer insulating film on the entire surface at a film formation temperature of 400° C. by, e.g., atmospheric CVD. After that, contact holes are formed in the interlayer insulating film, and source·drain electrodes, a gate electrode, interconnections and the like are formed.

Figure 13:
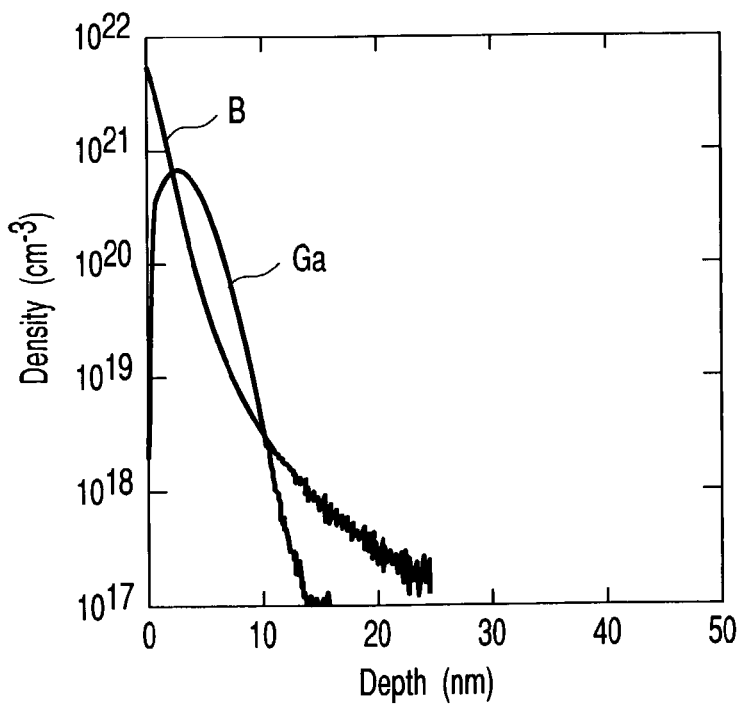
FIG. 13 is a graph showing the density distributions of Ge and B in a semiconductor device obtained by the steps shown in FIGS. 12A to 12C.

FIG. 13 shows the density distributions of Ga and B obtained by the steps shown in FIGS. 12A to 12C. In this embodiment, a depth at which the Ga density is $10^{18}$ cm$^{-3}$ is about 11 nm, and a depth at which the B density is $10^{18}$ cm$^{-3}$ is about 14 nm. That is, Ga is not distributed in the whole impurity region into which B is implanted; the Ga diffusion layer is formed to be shallower than the B diffusion layer.

The sheet resistance of the diffusion layer was measured and found to be 850 Ω/□. This sheet resistance is lower than that in the second embodiment because Ga having the same conductivity type as B is activated. When the junction leakage current was measured, no leakage current increase was found. That is, the ion implantation of Ga did not deteriorate the p-n junction characteristics.

In this embodiment as described above, the same effects as in the first embodiment can be obtained. In addition, since the Ga diffusion layer is made shallower than the B diffusion layer as in the second embodiment, it is possible to reduce the leakage current and suppress B diffusion. Accordingly, fine transistors superior in characteristics and reliability can be obtained.

In the third embodiment described above, B (impurity element) is ion-implanted after Ga (group III element) which is in the same group as B is ion-implanted. However, a group III element can be ion-implanted after an impurity element is ion-implanted. As a group III element, an element heavier (larger in mass number) than an impurity element can be used. That is, In (indium) or Tl (thallium) can be used instead of Ga. Furthermore, the dose of a group III element need only fall within the range in which a certain amount of crystal defects or more are produced in the surface region of an Si substrate (preferably, within the range in which the surface region of an Si substrate is made amorphous). More specifically, the dose of a group III element is desirably $1\times10^{14}$ cm$^{-2}$ or more and $1\times10^{16}$ cm$^{-2}$ or less.

In the above third embodiment, a p-channel MOS (MIS) FET is explained. However, a similar method can also be applied to an n-channel MOS (MIS) FET. In this case, phosphorus (P) or arsenic (As) is used as an n-type impurity to be implanted into a p-type silicon substrate. In this case, as an element (group V element) which is in the same group as phosphorus and arsenic, Sb or Bi heavier (larger in mass number) than phosphorus and arsenic can be used.

In the first to third embodiments explained above, the flash lamp annealing conditions are an irradiation energy density of 35 J/cm$^2$ and a substrate temperature of 400° C. However, the substrate temperature can be changed over the range of 200 to 550° C., and the irradiation energy density can be changed over the range of 10 to 60 J/cm$^2$. The substrate temperature is 500° C. or less in order to prevent recovery of the crystal defect regions before flash lamp irradiation. The irradiation energy density is 60 J/cm$^2$ or less in order to prevent an increase in the thermal stress by excessive and abrupt irradiation energy, thereby preventing damage such as slips or cracks in an Si substrate. The substrate temperature is 200° C. or more because if the substrate temperature is less than 200° C., irradiation energy exceeding 60 J/cm$^2$ is required to activate impurities. As a substrate preheating method, lamp heating using a halogen lamp or the like or heater heating using a hot plate or the like can be used.

In each of the above first to third embodiments, the formation of shallow source·drain diffusion layers, i.e., the formation of extension regions is explained. However, the aforementioned method is also applicable to the formation of deep source·drain diffusion layers, polysilicon gate electrodes, or channel regions.

Also, in each of the above first to third embodiments, annealing using a flash lamp as a light source is explained. However, a light source other than a flash lamp is also usable provided that a maximum point of the emission intensity distribution of the light is 600 nm or less (preferably, 500 nm or less). The emission period is desirably 100 msec or less, and more desirably, 10 msec or less. An excimer laser can be used as a light source other than a flash lamp.

FOURTH EMBODIMENT

FIGS. 14A to 14F are sectional views showing a semiconductor device fabrication method according to the fourth embodiment of the present invention. This embodiment relates to a MOS transistor fabrication method using the methods of the first to third embodiments described above. Basically, therefore, the various items explained in the first to third embodiments are properly applicable (this similarly applies to the fifth to seventh embodiments).

Figure 14A:
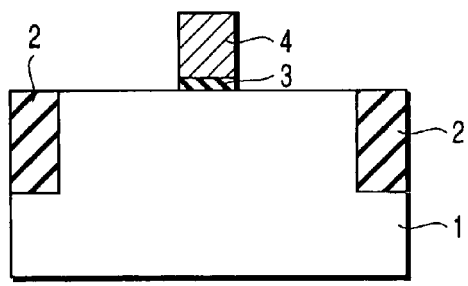
FIGS. 14A to 14F are sectional views showing a semiconductor device fabrication method according to the fourth embodiment of the present invention.

First, as shown in FIG. 14A, in accordance with the conventional MOS transistor fabrication method, isolation regions 2 are formed in an n-type silicon (Si) substrate 1. After that, a gate insulating film (silicon oxide film) 3 is formed, and a gate electrode 4 is formed on this gate insulating film 3.

Figure 14B:
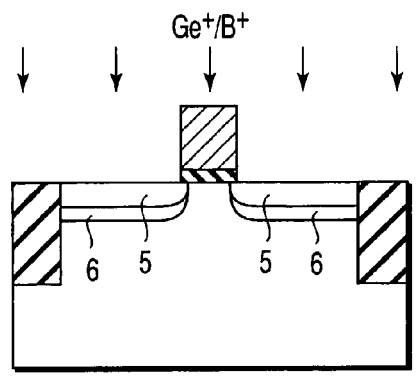

Next, as shown in FIG. 14B, the gate electrode 4 is used as a mask to ion-implant Ge into the surface region of the silicon substrate 1. The conditions of this ion implantation are an acceleration energy of 1 keV and a dose of $5\times10^{14}$ cm$^{-2}$. By this ion implantation, crystal defect regions 5 are formed from the surface of the silicon substrate 1 to a depth of 10 nm. The gate electrode 4 is again used as a mask to ion-implant B into the surface region of the silicon substrate 1. The ion implantation conditions are an acceleration energy of 0.2 keV and a dose of $1\times10^{15}$ cm$^{-2}$. By this ion implantation, impurity regions 6 are so formed as to overlap the crystal defect regions 5.

Figure 14C:
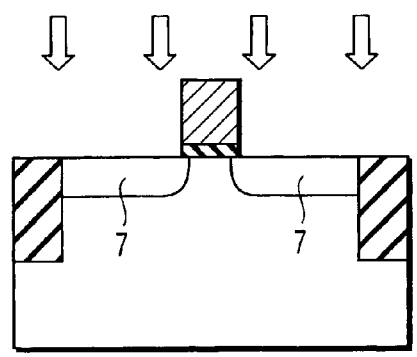

Subsequently, as shown in FIG. 14C, the entire substrate surface is irradiated with light of a Xe flash lamp, while the substrate is heated to a temperature of about 400° C. The irradiation time is 10 ms or less, and the irradiation energy density is 35 J/cm$^2$. This light irradiation activates the impurity elements and recovers defects in the crystal defect regions 5 and the impurity regions 6. Consequently, shallow source·drain diffusion layers 7 (extension regions) adjacent to the gate electrode 4 are obtained.

Figure 14D:
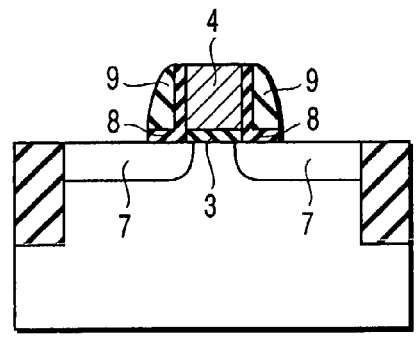

As shown in FIG. 14D, a silicon nitride film (SiN film) and a silicon oxide film (SiO$_2$ film) are deposited in this order by CVD. Subsequently, RIE is used to selectively leave the silicon nitride film 8 and the silicon oxide film 9 on the side walls of the gate electrode 4, thereby forming side wall spacers having a multilayered structure.

Figure 14E:
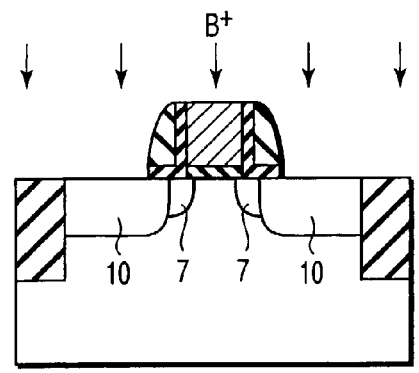

As shown in FIG. 14E, B is ion-implanted by using the gate electrode 4 and the side wall spacers including the silicon nitride film 8 and the silicon oxide film 9 as masks. The ion implantation conditions are an acceleration energy of 5 keV and a dose of $3\times10^{15}$ cm$^{-2}$. By this ion implantation, deep impurity regions 10 separated from the end portions of the gate electrode 4 are formed. This ion implantation also implants B into the gate electrode (polysilicon).

Figure 14F:
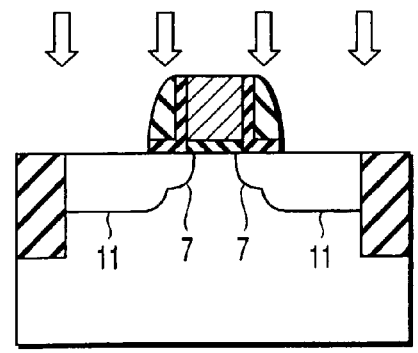

Next, as shown in FIG. 14F, the entire substrate surface is irradiated with light of the Xe flash lamp, while the substrate is heated to a temperature of about 400° C. The irradiation time is 10 ms or less, and the irradiation energy density is 35 J/cm$^2$. This light irradiation activates the ion-implanted impurity elements and recovers defects in the impurity regions 10 and the like. Consequently, deep source·drain diffusion layers 11 separated from the end portions of the gate electrode 4 are obtained.

Although the subsequent steps are not shown, a silicon oxide film is formed as an interlayer insulating film on the entire surface at a film formation temperature of 400° C. by, e.g., atmospheric CVD. After that, contact holes are formed in the interlayer insulating film, and source·drain electrodes, a gate electrode, interconnections and the like are formed.

In this embodiment, the use of flash lamp anneal can shorten the thermal annealing time for activating the shallow impurity regions 6 adjacent to the gate electrode 4. This minimizes diffusion of impurities to a portion below the gate electrode and suppresses the short channel effect. In addition, the heating efficiency rises because crystal defect regions are formed in the surface region of an Si substrate by ion implantation of Ge before flash lamp light irradiation. Accordingly, the resistance of the diffusion layer can be effectively lowered, and this improves the electric current driving capability of a MOS transistor.

FIFTH EMBODIMENT

FIGS. 15A to 15F are sectional views showing a semiconductor device fabrication method according to the fifth embodiment of the present invention. This embodiment also relates to a MOS transistor fabrication method using the methods of the first to third embodiments described above.

Figure 15A:
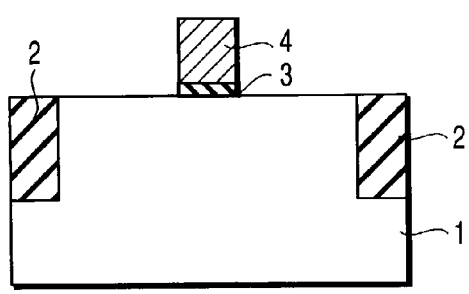
FIGS. 15A to 15F are sectional views showing a semiconductor device fabrication method according to the fifth embodiment of the present invention.

First, as shown in FIG. 15A, in accordance with the conventional MOS transistor fabrication method, isolation regions 2 are formed in an n-type silicon (Si) substrate 1. After that, a gate insulating film (silicon oxide film) 3 is formed, and a gate electrode 4 is formed on this gate insulating film 3.

Figure 15D:
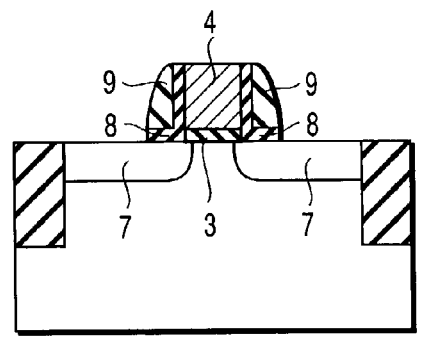
Figure 15B:
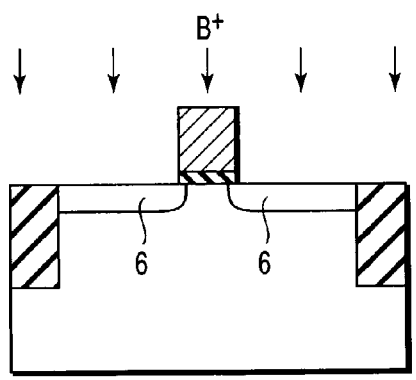

Next, as shown in FIG. 15B, the gate electrode 4 is used as a mask to ion-implant B into the surface region of the silicon substrate 1. The conditions of this ion implantation are an acceleration energy of 0.2 keV and a dose of $1\times10^{15}$ cm$^{-2}$. By this ion implantation, impurity regions 6 are formed.

Figure 15E:
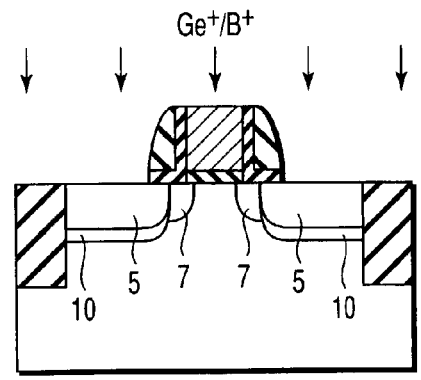
Figure 15C:
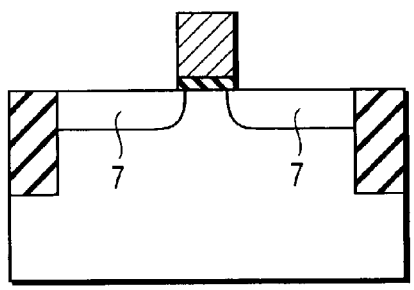

Subsequently, as shown in FIG. 15C, RTA using a halogen lamp is performed. The annealing conditions are a substrate temperature of 800° C. and a heating time of 10 sec. This annealing activates the impurity element and recovers defects in the impurity regions 6. Consequently, shallow source·drain diffusion layers 7 (extension regions) adjacent to the gate electrode 4 are obtained.

As shown in FIG. 15D, a silicon nitride film (SiN film) and a silicon oxide film (SiO$_2$ film) are deposited in this order by CVD. Subsequently, RIE is used to selectively leave the silicon nitride film 8 and the silicon oxide film 9 on the side walls of the gate electrode 4, thereby forming side wall spacers having a multilayered structure.

As shown in FIG. 15E, Ge is ion-implanted by using the gate electrode 4 and the side wall spacers including the silicon nitride film 8 and the silicon oxide film 9 as masks. The ion implantation conditions are an acceleration energy of 15 keV and a dose of $5\times10^{14}$ cm$^{-2}$. By this ion implantation, amorphous regions (crystal defect regions 5) are formed from the surface of the silicon substrate 1 to a depth of 20 nm. After that, B is ion-implanted by using the gate electrode and the side wall spacers as masks. The ion implantation conditions are an acceleration energy of 5 keV and a dose of $3\times10^{15}$ cm$^{-2}$. By this ion implantation, deep impurity regions 10 separated from the end portions of the gate electrode 4 are formed. This ion implantation also implants B into the gate electrode (polysilicon).

Figure 15F:
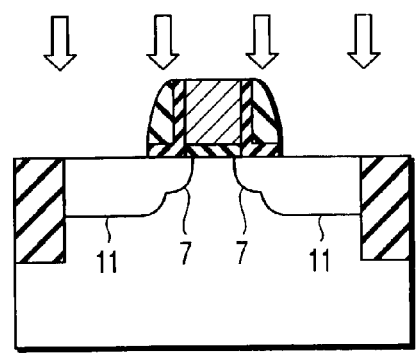

Next, as shown in FIG. 15F, the entire substrate surface is irradiated with light of the Xe flash lamp, while the substrate is heated to a temperature of about 400° C. The irradiation time is 10 ms or less, and the irradiation energy density is 35 J/cm$^2$. This light irradiation activates the ion-implanted impurity elements and recovers crystal defects in the impurity regions 10 and the like. Consequently, deep source·drain diffusion layers 11 separated from the end portions of the gate electrode 4 are obtained.

Although the subsequent steps are not shown, a silicon oxide film is formed as an interlayer insulating film on the entire surface at a film formation temperature of 400° C. by, e.g., atmospheric CVD. After that, contact holes are formed in the interlayer insulating film, and source·drain electrodes, a gate electrode, interconnections and the like are formed.

In this embodiment, the shallow impurity diffusion layers 7 are exposed to a high temperature only in the flash lamp annealing step for activating the deep impurity regions 10. This minimizes diffusion of impurities to a portion below the gate electrode and suppresses the short channel effect. In addition, since the number of times of flash lamp irradiation reduces, the generation of thermal stress caused by an abrupt temperature rise can be suppressed. This can reduce substrate damage and improve the yield. Also, the surface region of an Si substrate is made amorphous by Ge ion implantation before flash lamp irradiation. This improves the recovery of crystallinity and raises the heating efficiency. Accordingly, the resistance of the diffusion layer can be effectively lowered, and this improves the electric current driving capability of a MOS transistor.

SIXTH EMBODIMENT

FIGS. 16A to 16F are sectional views showing a semiconductor device fabrication method according to the sixth embodiment of the present invention. This embodiment also relates to a MOS transistor fabrication method using the methods of the first to third embodiments described above.

Figure 16A:
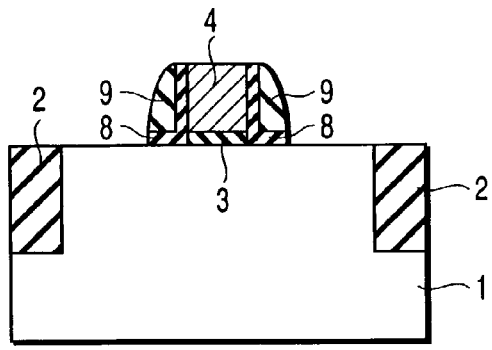
FIGS. 16A to 16F are sectional views showing a semiconductor device fabrication method according to the sixth embodiment of the present invention.

First, as shown in FIG. 16A, in accordance with the conventional MOS transistor fabrication method, isolation regions 2 are formed in an n-type silicon (Si) substrate 1. After that, a gate insulating film (silicon oxide film) 3 is formed, and a gate electrode 4 is formed on this gate insulating film 3. A silicon nitride film (SiN film) and a silicon oxide film ($SiO_2$ film) are deposited in this order by CVD. Subsequently, RIE is used to selectively leave the silicon nitride film 8 and the silicon oxide film 9 on the side walls of the gate electrode 4, thereby forming side wall spacers having a multilayered structure.

Figure 16D:
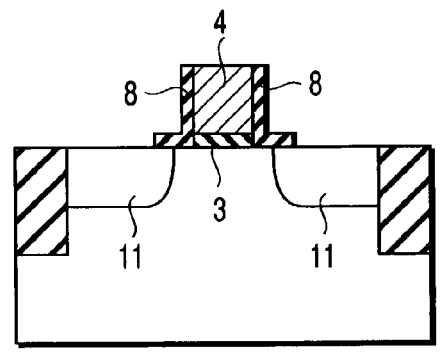
Figure 16B:
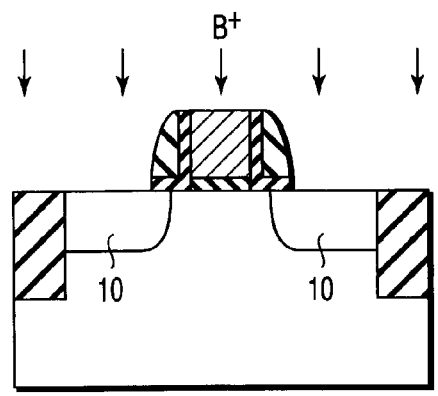

Next, as shown in FIG. 16B, the gate electrode 4 and the side wall spacers are used as masks to ion-implant B. The conditions of this ion implantation are an acceleration energy of 5 keV and a dose of $3\times10^{15}$ $cm^{-2}$. By this ion implantation, deep impurity regions 10 separated from the end portions of the gate electrode 4 are formed. This ion implantation also implants B into the gate electrode (polysilicon).

Figure 16E:
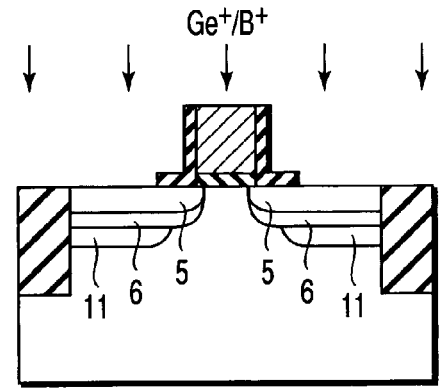
Figure 16C:
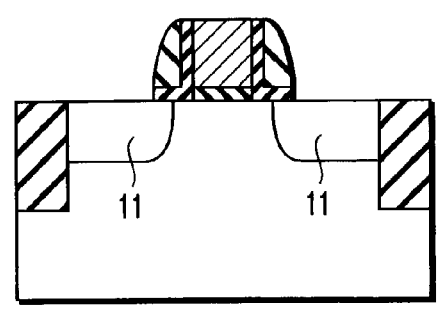

Subsequently, as shown in FIG. 16C, RTA using a halogen lamp is performed. The annealing conditions are a substrate temperature of 1,015° C. and a heating time of 10 sec. This annealing activates the impurity element and recovers defects in the impurity regions 10. Consequently, deep source·drain diffusion layers 11 separated from the gate electrode 4 are obtained.

As shown in FIG. 16D, the silicon oxide film 9 forming a part of the side wall spacers is selectively etched by hydrofluoric acid (HF).

As shown in FIG. 16E, Ge is ion-implanted by using the gate electrode 4 and the silicon nitride film 8 as masks. The ion implantation conditions are an acceleration energy of 1 keV and a dose of $5\times10^{14}$ $cm^{-2}$. By this ion implantation, crystal defect regions 5 are formed from the surface of the silicon substrate 1 to a depth of 10 nm. After that, B is ion-implanted by using the gate electrode 4 and the silicon nitride film 8 as masks. The ion implantation conditions are an acceleration energy of 0.2 keV and a dose of $1\times10^{15}$ $cm^{-2}$. By this ion implantation, shallow impurity regions 6 adjacent to the end portions of the gate electrode 4 are formed.

Figure 16F:
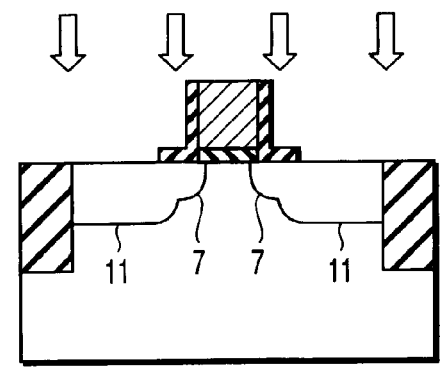

Next, as shown in FIG. 16F, the entire substrate surface is irradiated with light of the Xe flash lamp, while the substrate is heated to a temperature of about 400° C. The irradiation time is 10 ms or less, and the irradiation energy density is 35 $J/cm^2$. This light irradiation activates the ion-implanted impurity elements and recovers crystal defects in the impurity regions 6 and the like. Consequently, shallow source·drain diffusion layers 7 adjacent to the gate electrode 4 are obtained.

Although the subsequent steps are not shown, a silicon oxide film is formed as an interlayer insulating film on the entire surface at a film formation temperature of 400° C. by, e.g., atmospheric CVD. After that, contact holes are formed in the interlayer insulating film, and source·drain electrodes, a gate electrode, interconnections and the like are formed.

In this embodiment, the shallow source·drain diffusion layers 7 are formed after the deep source·drain diffusion layers 11 are formed. Therefore, the shallow impurity regions 6 are not exposed to the high temperature of the order of seconds for activating the deep impurity regions 10. This minimizes diffusion of impurities to a portion below the gate electrode and suppresses the short channel effect. In addition, since the number of times of flash lamp irradiation reduces, the generation of thermal stress caused by an abrupt temperature rise can be suppressed. This can reduce substrate damage and improve the yield. Also, the heating efficiency rises because crystal defect regions are formed in the surface region of an Si substrate by Ge ion implantation before flash lamp light irradiation. Accordingly, the resistance of the diffusion layer can be effectively lowered, and this improves the electric current driving capability of a MOS transistor.

In each of the fourth to sixth embodiments described above, a p-type MOS transistor is explained as an example. However, the above-mentioned method is also applicable to an n-type MOS transistor. In addition, various changes as explained in the first to third embodiments can be made.

SEVENTH EMBODIMENT

FIGS. 17A to 17E are sectional views showing a semiconductor device fabrication method according to the seventh embodiment of the present invention.

Figure 17A:
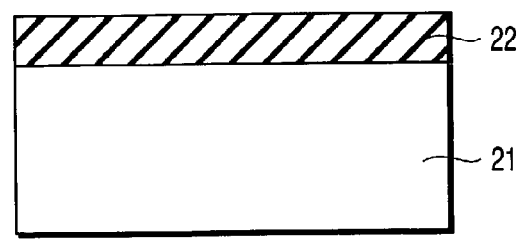
FIGS. 17A to 17E are sectional views showing a semiconductor device fabrication method according to the seventh embodiment of the present invention.
Figure 17B:
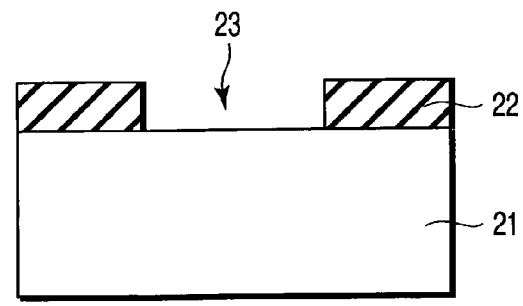

First, as shown in FIG. 17A, a 200-nm thick silicon oxide film ($SiO_2$ film) 22 is deposited on an n-type silicon substrate 21 by CVD. Next, as shown in FIG. 17B, this silicon oxide film 22 is patterned to open a 0.3 μm×0.3 μm contact hole 23.

Figure 17C:
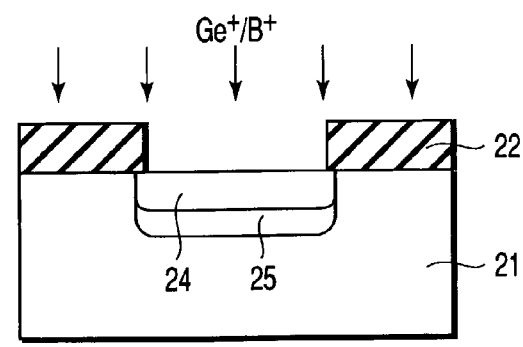

As shown in FIG. 17C, the silicon oxide film 22 is used as a mask to ion-implant Ge into the surface region of the silicon substrate 21. The ion implantation conditions are an acceleration energy of 15 keV and a dose of $5\times10^{14}$ $cm^{-2}$. By this ion implantation, a crystal defect region 24, e.g., an amorphous region, is formed in the surface of the silicon substrate 21. The silicon oxide film 22 is again used as a mask to ion-implant B into the surface region of the silicon substrate 21. The ion implantation conditions are an acceleration energy of 5 keV and a dose of $5\times10^{15}$ $cm^{-2}$. By this ion implantation, an impurity region 25 is formed below the crystal defect region 24 so as to overlap this crystal defect region 24.

Figure 17D:
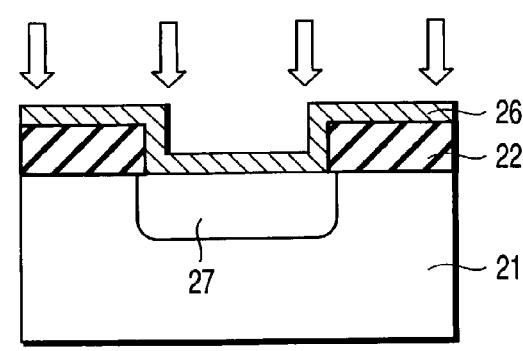

As shown in FIG. 17D, a metal film 26 having a thickness of 30 nm or less is formed on the entire surface. This metal film 26 is desirably made of a metal such as Ti capable of reducing a native oxide film on the silicon substrate. Generally, it is possible to use group IIIa, IVa, and Va refractory metals.

Subsequently, the entire substrate surface is irradiated with light of a Xe flash lamp while the substrate is heated to a temperature of about 400° C. The irradiation time is 10 ms or less, and the irradiation energy density is 35 $J/cm^2$. This light irradiation (flash lamp anneal) activates the impurity elements and recovers defects in the crystal defect region 24 and the impurity region 25, forming a diffusion layer 27. Also, by this flash lamp anneal, an excellent ohmic contact can be obtained between the metal film 26 and the diffusion layer 27.

Figure 17E:
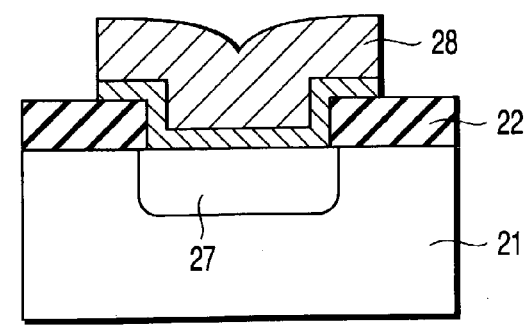

As shown in FIG. 17E, an Al film (film thickness=400 nm), for example, is deposited as a low-resistivity metal film 28. In addition, the metal films 26 and 28 are patterned to form an electrode.

The contact resistance between the Al electrode 28 and the silicon substrate 21 obtained by the above steps was measured and found to be $6\times10^{-8}$ $\Omega cm^2$. In contrast, in a sample of a comparative example obtained by ion-implanting only B without ion-implanting Ge, the contact resistance was $3\times10^{-7}$ $\Omega$cm$^2$. These results indicate that in this embodiment the contact resistance is significantly reduced compared to a comparative example.

Generally, when a metal and a semiconductor are in contact, a barrier layer exists in the semiconductor to generate a contact resistance. By generating crystal defects in the substrate surface (i.e., by making the substrate surface amorphous) by ion implantation of Ge, a localized level can be formed in the barrier layer. Accordingly, carriers readily move via this localized level formed in the barrier, without exceeding the barrier like a thermionic emission current. In this embodiment, therefore, the contact resistance significantly lowers presumably because a recombination ohmic contact is formed.

In the above embodiment, the Ge (predetermined element) ion implantation step, B (impurity element) ion implantation step, and metal film (conductive film) 26 formation step can be performed in an arbitrary order.

In this embodiment as described above, it is possible to obtain a shallow, low-resistance diffusion layer and an excellent ohmic contact.

Note that various changes as described in the first to third embodiments can also be made in this embodiment. For example, in this embodiment a p-type diffusion layer is formed by ion-implanting boron (B). However, an n-type diffusion layer can also be formed by ion-implanting phosphorus (P) or arsenic (As). Additionally, Si, Sn, or Pb can be ion-implanted as a group IV element instead of Ge. To form a p-type diffusion layer, Ga, In, or Tl as a group III element can be ion-implanted instead of Ge. Furthermore, to form an n-type diffusion layer, Sb or Bi as a group V element can be ion-implanted instead of Ge.

Additional advantages and modifications will readily occur to those skilled in the art. Therefore, the invention in its broader aspects is not limited to the specific details and representative embodiments shown and described herein. Accordingly, various modifications may be made without departing from the spirit and scope of the general inventive concept as defined by the appended claims and their equivalents.

What is claims is:

1. A method for manufacturing a semiconductor device comprising:
    implanting ions of an impurity element into a semiconductor region;
    implanting, into the semiconductor region, ions of a predetermined element which is a group IV element or an element having the same conductivity type as the impurity element and larger in mass number than the impurity element; and
    annealing an amorphous region into which the ions of the impurity element and the predetermined element are implanted by irradiating the amorphous region with light of a flash lamp to activate the implanted ions of the impurity element and form an impurity diffusion layer containing the activated implanted ions, the impurity diffusion layer having a junction depth of 20 nm or less,
    wherein annealing the amorphous region by irradiating the amorphous region with the light of the flash lamp is performed with the semiconductor region preheated under a condition that an amorphous state of the amorphous region is maintained.

2. The method according to claim 1, further comprising forming a conductive film on the semiconductor region before annealing the amorphous region.

3. The method according to claim 1, wherein the predetermined element is Si, Ge, Sn, Pb, Ga, In, Tl, Sb, or Bi.

4. The method according to claim 1, wherein an emission period of the light is not more than 100 msec.

5. The method according to claim 1, wherein an irradiation energy density of the light is not less than 10 J/cm$^2$ and not more than 60 J/cm$^2$.

6. The method according to claim 1, wherein the light has an emission intensity distribution, a maximum point of the distribution existing in a wavelength region of not more than 600 nm.

7. The method according to claim 1, wherein the predetermined element has a density distribution in a depth direction, and a value of a depth of a maximum point of the density distribution is smaller than a value of the junction depth of the impurity diffusion layer.

8. A method for manufacturing a semiconductor device comprising:
    forming a gate insulating film on a semiconductor substrate;
    forming a gate electrode on the gate insulating film;
    implanting ions of an impurity element into the semiconductor substrate by using at least the gate electrode as a mask;
    implanting, into the semiconductor substrate, ions of a predetermined element which is a group IV element or an element having the same conductivity type as the impurity element and larger in mass number than the impurity element, by using at least the gate electrode as a mask; and
    annealing an amorphous region into which the ions of the impurity element and the predetermined element are implanted by irradiating the amorphous region with light of a flash lamp to activate the implanted ions of the impurity element to form an impurity diffusion layer containing the activated implanted ions, the impurity diffusion layer having a junction depth of 20 nm or less,
    wherein annealing the amorphous region by irradiating the amorphous region with the light of the flash lamp is performed with the semiconductor substrate preheated under a condition that an amorphous state of the amorphous region is maintained.

9. The method according to claim 8, wherein the predetermined element is Si, Ge, Sn, Pb, Ga, In, Tl, Sb, or Bi.

10. The method according to claim 8, wherein an emission period of the light is not more than 100 msec.

11. The method according to claim 8, wherein an irradiation energy density of the light is not less than 10 J/cm$^2$ and not more than 60 J/cm$^2$.

12. The method according to claim 8, wherein the light has an emission intensity distribution, a maximum point of the distribution existing in a wavelength region of not more than 600 nm.

13. The method according to claim 8, wherein the predetermined element has a density distribution in a depth direction, and a value of a depth of a maximum point of the density distribution is smaller than a value of the junction depth of the impurity diffusion layer.

14. A method for manufacturing a semiconductor device comprising:
    forming a gate insulating film on a semiconductor substrate;
    forming a gate electrode on the gate insulating film;
    implanting ions of a first impurity element into the semiconductor substrate by using at least the gate electrode as a mask;

implanting, into the semiconductor substrate, ions of a predetermined element which is a group IV element or an element having the same conductivity type as the first impurity element and larger in mass number than the first impurity element, by using at least the gate electrode as a mask;

annealing an amorphous region into which the ions of the first impurity element and the predetermined element are implanted by irradiating the amorphous region with light of a flash lamp to activate the implanted ions of the first impurity element to form a first source/drain diffusion layer;

implanting ions of a second impurity element into the semiconductor substrate by using at least the gate electrode as a mask, after forming the first source/drain diffusion layer; and annealing a region into which the ions of the second impurity element are implanted by irradiating the region with light of a flash lamp to activate the implanted ions of the second impurity element to form a second source/drain diffusion, layer having a depth greater than that of the first source/drain diffusion layer.

15. The method according to claim 14, wherein annealing the amorphous region by irradiating the amorphous region with the light of the flash lamp is performed with the semiconductor substrate preheated under a condition that an amorphous state of the amorphous region is maintained.

16. A method for manufacturing a semiconductor device comprising:

forming a gate insulating film on a semiconductor substrate;

forming a gate electrode on the gate insulating film;

implanting ions of a first impurity element into the semiconductor substrate by using at least the gate electrode as a mask;

annealing a region into which the ions of the first impurity element are implanted to activate the implanted ions of the first impurity element to form a first source/drain diffusion layer;

implanting ions of a second impurity element into the semiconductor substrate by using at least the gate electrode as a mask, after forming the first source/drain diffusion layer;

implanting, into the semiconductor substrate, ions of a predetermined element which is a group IV element or an element having the same conductivity type as the second impurity element and larger in mass number than the second impurity element, by using at least the gate electrode as a mask, after forming the first source/drain diffusion layer; and annealing an amorphous region into which the ions of the second impurity element and the predetermined element are implanted by irradiating the amorphous region with light of a flash lamp to activate the implanted ions of the second impurity element to form a second source/drain diffusion layer having a depth greater than that of the first source/drain diffusion layer.

17. The method according to claim 16, wherein annealing the amorphous region by irradiating the amorphous region with the light of the flash lamp is performed with the semiconductor substrate preheated under a condition that an amorphous state of the amorphous region is maintained.

18. A method for manufacturing a semiconductor device comprising:

forming a gate insulating film on a semiconductor substrate;

forming a gate electrode on the gate insulating film;

implanting ions of a first impurity element into the semiconductor substrate by using at least the gate electrode as a mask;

annealing a region into which the ions of the first impurity element are implanted to activate the implanted ions of the first impurity element to form a first source/drain diffusion layer;

implanting ions of a second impurity element into the semiconductor substrate by using at least the gate electrode as a mask, after forming the first source/drain diffusion layer;

implanting, into the semiconductor substrate, ions of a predetermined element which is a group IV element or an element having the same conductivity type as the second impurity element and larger in mass number than the second impurity element, by using at least the gate electrode as a mask, after forming the first source/drain diffusion layer; and annealing an amorphous region into which the ions of the second impurity element and the predetermined element are implanted by irradiating the amorphous region with light of a flash lamp to activate the implanted ions of the second impurity element to form a second source/drain diffusion layer having a depth smaller than that of the first source/drain diffusion layer.

19. The method according to claim 18, wherein annealing the amorphous region by irradiating the amorphous region with the light of the flash lamp is performed with the semiconductor substrate preheated under a condition that an amorphous state of the amorphous region is maintained.

* * * * *